(12) United States Patent
Jeon et al.

(10) Patent No.: US 8,114,771 B2
(45) Date of Patent: Feb. 14, 2012

(54) SEMICONDUCTOR WAFER SCALE PACKAGE SYSTEM

(75) Inventors: Hyung Jun Jeon, Seoul (KR); Tae Keun Lee, Ichon-si (KR); Young Chan Ko, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 520 days.

(21) Appl. No.: 11/615,923

(22) Filed: Dec. 22, 2006

(65) Prior Publication Data

US 2007/0164422 A1 Jul. 19, 2007

Related U.S. Application Data

(60) Provisional application No. 60/766,380, filed on Jan. 13, 2006.

(51) Int. Cl.
*H01L 21/44* (2006.01)
(52) U.S. Cl. ............... 438/667; 438/108; 257/E23.174
(58) Field of Classification Search ............ 438/667, 438/108; 257/698, E23.174
See application file for complete search history.

(56) References Cited

U.S. PATENT DOCUMENTS

| | | | |
|---|---|---|---|
| 6,838,310 B1 | 1/2005 | Hsuan | |
| 6,962,867 B2 * | 11/2005 | Jackson et al. | 438/622 |
| 7,030,466 B1 | 4/2006 | Hsuan | |
| 7,115,972 B2 * | 10/2006 | Dotta et al. | 257/621 |
| 7,129,576 B2 * | 10/2006 | Humpston | 257/704 |
| 2001/0049187 A1 * | 12/2001 | Enomoto et al. | 438/618 |
| 2004/0188837 A1 * | 9/2004 | Kim et al. | 257/738 |
| 2005/0277288 A1 | 12/2005 | Ozguz et al. | |
| 2006/0033212 A1 * | 2/2006 | Kim et al. | 257/738 |
| 2006/0046471 A1 | 3/2006 | Kirby et al. | |
| 2007/0045779 A1 * | 3/2007 | Hiatt | 257/621 |

* cited by examiner

*Primary Examiner* — Evan Pert
*Assistant Examiner* — Selim Ahmed
(74) *Attorney, Agent, or Firm* — Mikio Ishimaru

(57) ABSTRACT

A semiconductor wafer scale package system is provided including providing a semiconductor substrate having a through-hole via with a conductive coating, forming a filled via by filling the through-hole via with a conductive material, coupling a package substrate to the filled via, and singulating a chip scale package from the semiconductor substrate and the package substrate.

10 Claims, 5 Drawing Sheets

SEMICONDUCTOR WAFER SCALE PACKAGE SYSTEM

CROSS-REFERENCE TO RELATED APPLICATION

This application claims the benefit of U.S. Provisional Patent Application Ser. No. 60/766,380 filed Jan. 13, 2006.

TECHNICAL FIELD

The present invention relates generally to integrated circuit packaging, and more particularly to a system for wafer level packaging an integrated circuit having a through hole via.

BACKGROUND ART

Many of today's most popular electronic devices are shrinking in size while multiplying in features and function. Devices like hand held computers, personal audio/video players, cell phones with video recorders built in or personal global positioning systems are stressing the packaging capabilities as we know them today. Devices that need shorter signal paths cannot afford to have signals routed out of a package, through a printed circuit board, and back into another package. In order to enable shorter paths, some manufacturers of integrated circuit wafers have developed a through-hole via technology in the semiconductor wafer. While creating a much shorter interconnect path, this technology has created a difficult packaging problem that may adversely affect the reliability of the end products as well as reducing the manufacturing yields.

The conventional wafer scale packaging techniques utilize flip chip integrated circuit wafers mounted on a re-distribution substrate or thin film structure that provides a means for attaching the integrated circuit to the next system level. When integrating the latest wafer technology, having through-hole vias, other possibilities exist to allow flexible packaging. One possibility is to mount the wafer on the substrate with the backside of the wafer toward the substrate. In this configuration the active side contacts are available to connect another integrated circuit function.

The through hole via provides very efficient distribution of power and heat. It also presents a difficult attachment issue. The reliability of the die attach may be compromised by voids that form in the die attach material within the through-hole via. Another issue that can degrade the reliability of the device is that out-gassing of the die attach material during subsequent processing of the package could fracture the narrow end of the through hole via.

If the die is not firmly attached to the substrate forming the package bottom, thermal expansion and contraction will quickly damage the device, rendering it inoperative in a short period of time.

Thus, a need still remains for semiconductor wafer scale package system that can support wafers with through-hole vias. In view of the lower source voltages and distribution and increasing levels of integration, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have long been sought but prior developments have not taught or suggested any solutions and, thus, solutions to these problems have long eluded those skilled in the art.

DISCLOSURE OF THE INVENTION

The present invention provides a semiconductor wafer scale package system including providing a semiconductor substrate having a through-hole via with a conductive coating, forming a filled via by filling the through-hole via with a conductive material, coupling a package substrate to the filled via, and singulating a chip scale package from the semiconductor substrate and the package substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
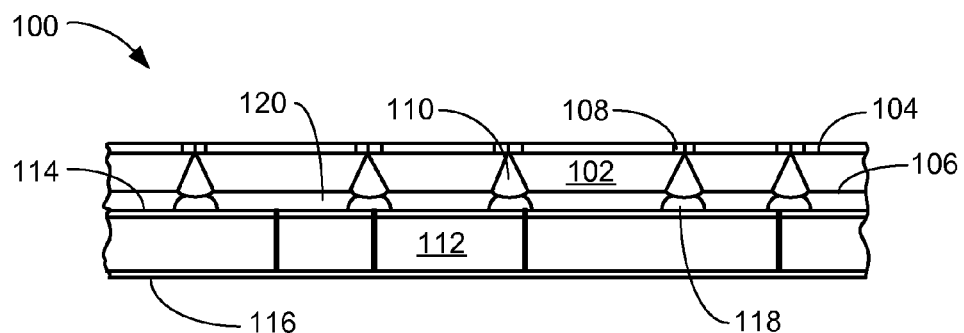
FIG. 1 is a cross-sectional view of a semiconductor wafer scale package system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Figure 2:
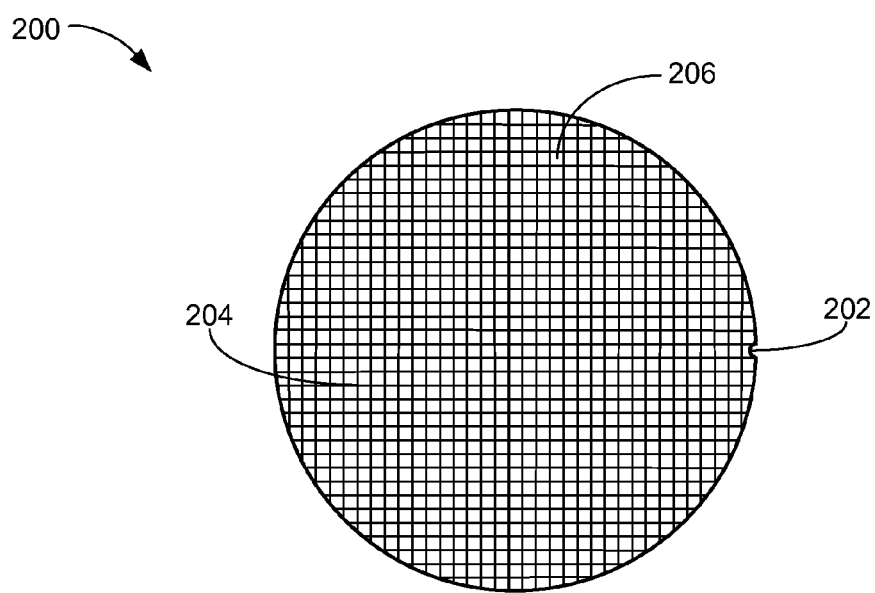
FIG. 2 is a backside view of a semiconductor wafer, in a via process phase of manufacturing.

Referring now to FIG. 1, therein is shown a cross-sectional view of a semiconductor wafer scale package system 100, in an embodiment of the present invention. The cross-sectional view of the semiconductor wafer scale package system 100, such as a wafer scale package, depicts a semiconductor substrate 102. The semiconductor substrate 102 may be a silicon wafer or a gallium arsenide (GaAs) wafer. The semiconductor substrate 102 has an active side 104, where semiconductor devices 206 of FIG. 2 are located, and a backside 106. A contact 108 on the active side 104 is coupled to a filled via 110 that has been treated and forms a coupling. The filled via 110 can be of any shape, but it has been found that a conical via with a small top opening conductively connected to the contact 108 and a large bottom open to the backside 106 is preferred.

A package substrate 112 has a component side 114 and a system side 116. The package substrate 112 may be a printed circuit board or a thin-film redistribution layer having the same size as the semiconductor substrate 102. The component side 114 of the package substrate 112 has a component interconnect 118, such as solder balls, solder bumps, solder columns, or stud bumps.

An adhesive material 120, such as a die attach material, supports and adheres the semiconductor substrate 102 to the component side 114 of the package substrate 112 around the component interconnect 118.

During the assembly process, the semiconductor substrate 102, having the active side 104 positioned away from the package substrate 112, is aligned with and coupled to the package substrate 112. All of the filled via 110 and the component interconnect 118 on the package substrate 112 are electrically coupled at the same time by a reflow process. This coupling allows direct distribution of voltages, a short thermal path, and a short signal path for high frequency or critical timing signals.

The semiconductor substrate 102 and the coupled package substrate 112 are still wafers forming the wafer scale package 100 that may have an encapsulant molded over the semiconductor substrate 102.

The wafer scale package 100 may be diced to form individual chip scale packages, such as quad flatpack no-lead (QFN) or ball grid array (BGA) packages. Since the individual chip scale packages are singulated from the wafer scale package 100, the sides of the individual semiconductor substrates 102 and the individual package substrates 112 will have the characteristics of being singulated in the same operation, such as sawing or breaking.

Thus, it has been discovered that the semiconductor wafer scale package system 100 of the present invention furnishes important and heretofore unknown and unavailable solutions, capabilities, and functional aspects for packaging semiconductor substrates 102 having through-hole vias.

Referring now to FIG. 2, therein is shown a backside view of the semiconductor wafer 200, in a via process phase of manufacturing. The semiconductor wafer 200 has an alignment notch 202 and a line of vias 204. The line of vias 204 borders a semiconductor device 206, such as an integrated circuit, and is connected to the semiconductor device 206 by a number of the contacts 108. The line of vias 204 may be positioned around the edge of the semiconductor device 206, or distributed throughout the geometry of the semiconductor device 206. By way of example, the line of vias 204 shown in FIG. 2 is aligned near the edge of the semiconductor device 206.

Figure 3:
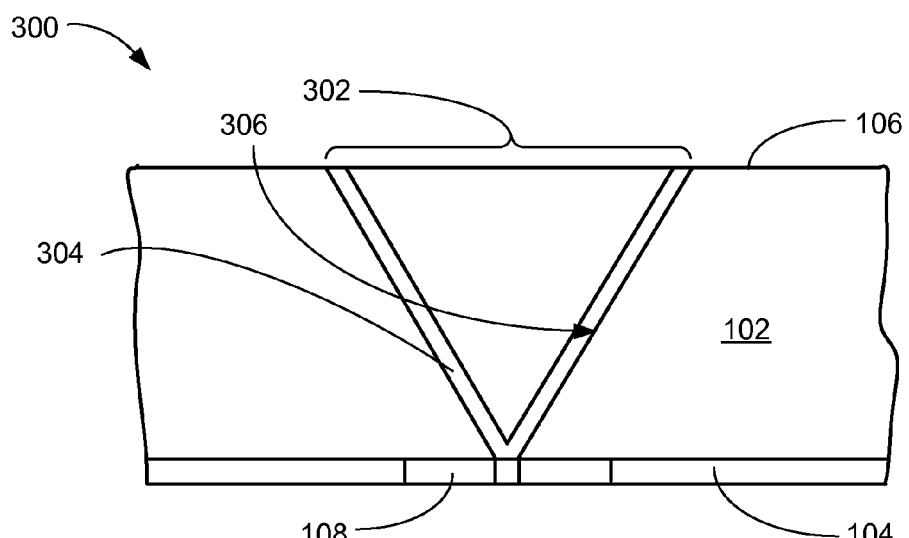
FIG. 3 is an enlarged cross-sectional view of a through-hole via formed in the semiconductor wafer of FIG. 2.

Referring now to FIG. 3, therein is shown an enlarged cross-sectional view of a through-hole via 302 formed in the semiconductor substrate 102 of FIG. 1. The enlarged cross-sectional view of the through-hole via 302 depicts the semiconductor substrate 102 having the through-hole via 302 in a geometric shape, such as conical shape. The through-hole via 302 emanates from the active side 104 of the semiconductor substrate 102 and opens to the backside 106. A conductive coating 304, such as a gold coating, lines a sidewall 306 of the through-hole via 302 and is formed directly on the semiconductor substrate 102. The conductive coating 304 may be electroplated or electroless plated.

The contact 108 may be an input/output pad or part of a re-distribution layer within the active side 104. The contact 108 is coupled directly to the conductive coating 304, which completely fills the opening in the semiconductor substrate 102, just above the contact 108, and the active side 104, including coupling the contact 108, for forming a conductive path from the active side 104 to the package substrate 112. The filling of the opening at the active side 104 by the conductive coating 304 assures a reliable connection to the contact 108.

Figure 4:
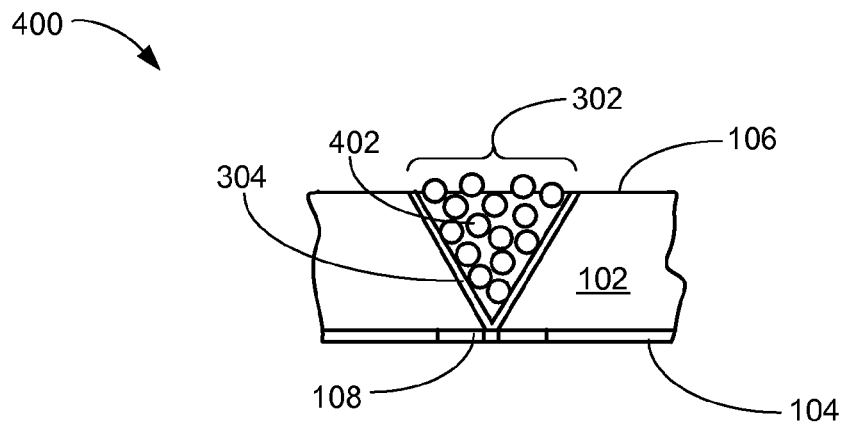
FIG. 4 is an enlarged cross-sectional view of a via formed in the semiconductor wafer, having solder paste deposited.

Referring now to FIG. 4, therein is shown an enlarged cross-sectional view of a via 400 formed in the semiconductor substrate 102 of FIG. 1, having solder paste deposited. The enlarged cross-sectional view of the via 400 depicts the semiconductor substrate 102 having the through-hole via 302 of FIG. 3. The through-hole via 302 emanates from the active side 104 of the semiconductor substrate 102 and opens to the backside 106. The conductive coating 304 lines the sidewall 306 of the through-hole via 302.

The contact 108 may be an input/output pad or part of a re-distribution layer within the active side 104. The contact 108 is coupled directly to the conductive coating 304, forming a conductive path from the active side 104 to the package substrate 112.

A conductive material 402, such as a solder paste, may be a eutectic or high temperature solder. The conductive material 402 may be deposited in the opening of the through-hole via 302. The conductive material 402 may be applied through a normal manufacturing process, such as screening.

Figure 5:
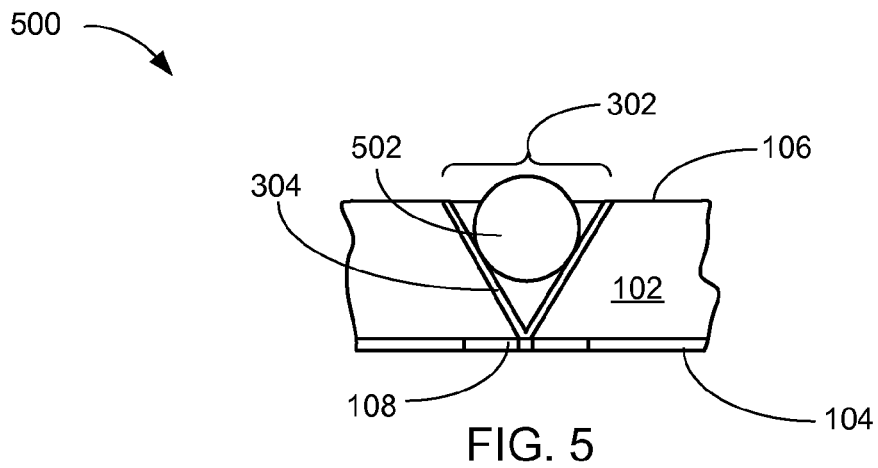
FIG. 5 is an enlarged cross-sectional view of a via formed in the semiconductor wafer, having a solder ball deposited.

Referring now to FIG. 5, therein is shown an enlarged cross-sectional view of a via 500 formed in the semiconductor substrate 102 of FIG. 1, having a solder ball deposited. The enlarged cross-sectional view of the via 500 depicts the semiconductor substrate 102 having the through-hole via 302. The through-hole via 302 emanates from the active side 104 of the semiconductor substrate 102 and opens to the backside 106. The conductive coating 304 lines the sidewall 306 of the through-hole via 302.

The contact 108 may be an input/output pad or part of a re-distribution layer within the active side 104. The contact 108 is coupled directly to the conductive coating 304, forming a conductive path from the active side 104 to the package substrate 112.

A conductive ball 502, such as a solder ball or solder bump, may be placed in the opening of the filled via 110. The conductive ball 502 may be composed of a eutectic or high temperature solder. The conductive ball 502 may be applied in a normal solder ball installation process.

Figure 6:
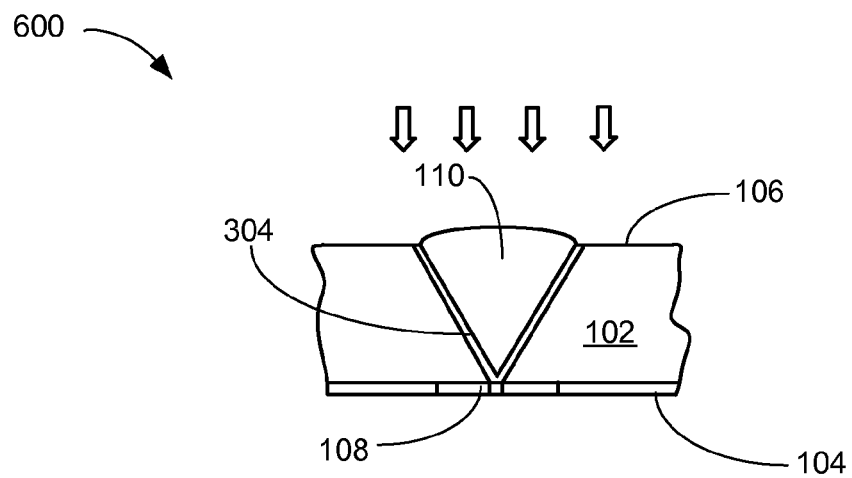
FIG. 6 is an enlarged cross-sectional view of a filled via in a solder re-flow phase of manufacture.

Referring now to FIG. 6, therein is shown an enlarged cross-sectional view of a filled via 600 in a solder re-flow phase of manufacture. The enlarged cross-sectional view of the filled via 600 depicts the semiconductor substrate 102 of FIG. 1 having the through-hole via 302 of FIG. 3. The through-hole via 302 emanates from the active side 104 of the semiconductor substrate 102 and opens to the backside 106. The conductive coating 304 lines the sidewall 306 of the through-hole via 302.

The contact 108 may be an input/output pad or part of a re-distribution layer within the active side 104. The contact 108 is coupled directly to the conductive coating 304, forming a conductive path from the active side 104 to the package substrate 112.

A reflow process, such as an infra-red or thermal flash process, is used to melt the conductive material 402 or the conductive ball 502 that resides in the opening of the through-hole via 302 creating the filled via 110. The filled via 110 supports the structure of the through-hole via 302 and it resolves any concerns about possible defects in the conductive coating 304. The filled via 110 is a good conductor of both electricity and heat.

Figure 7:
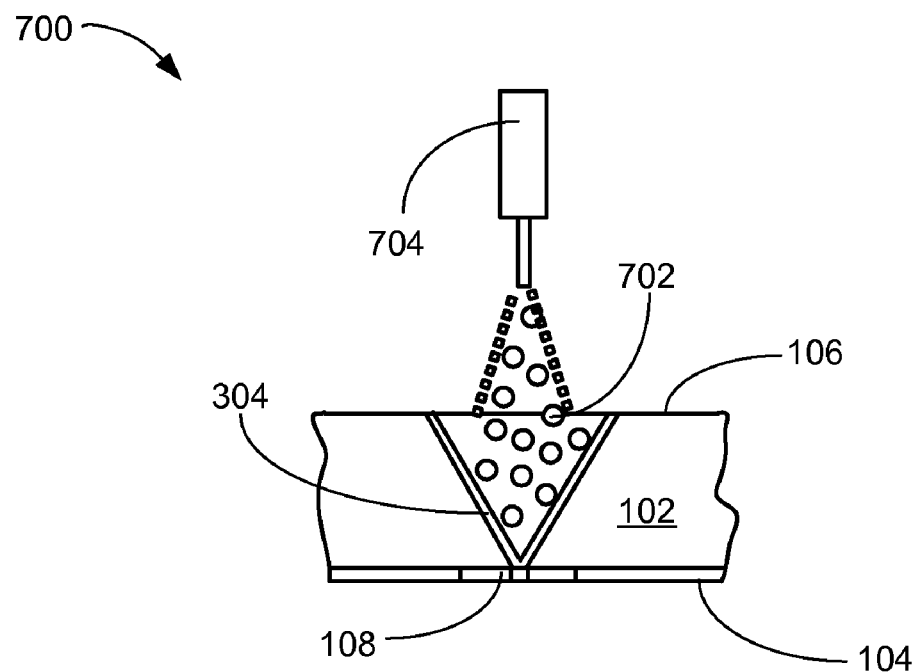
FIG. 7 is an enlarged cross-sectional view of the via formed in the semiconductor wafer, in a curable adhesive deposition phase of manufacturing.

Referring now to FIG. 7, therein is shown an enlarged cross-sectional view of a via 700 formed in the semiconductor substrate 102 of FIG. 1, in a curable adhesive deposition phase of manufacturing. The enlarged cross-sectional view of the via 700 depicts the semiconductor substrate 102 having the through-hole via 302 of FIG. 3. The through-hole via 302 emanates from the active side 104 of the semiconductor substrate 102 and opens to the backside 106. The conductive coating 304 lines the sidewall 306 of the through-hole via 302. The contact 108 may be an input/output pad or part of a re-distribution layer within the active side 104. The contact 108 is coupled directly to the conductive coating 304, forming a conductive path from the active side 104 to the package substrate 112.

A curable adhesive 702, such as a conductive epoxy, may be sprayed into the through-hole via 302 of FIG. 3. An adhesive dispenser 704 may be used to dispense or print the curable adhesive 702 into the through-hole via 302.

Figure 8:
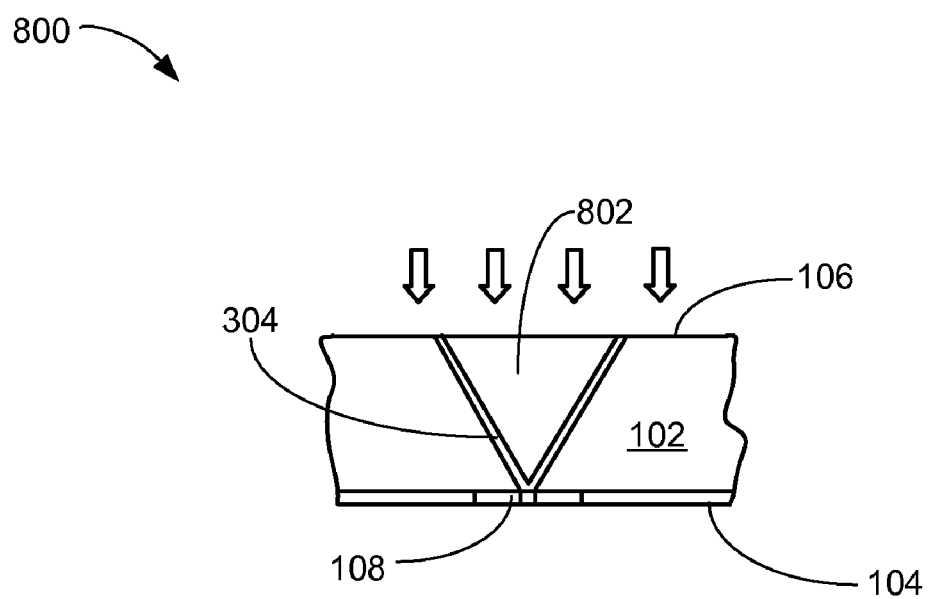
FIG. 8 is an enlarged cross-sectional view of the via of FIG. 7, in an adhesive curing phase of manufacture.

Referring now to FIG. 8, therein is shown an enlarged cross-sectional view of a via 800 in an adhesive curing phase of manufacture. The enlarged cross-sectional view of the via 800 depicts the semiconductor substrate 102 having the through-hole via 302 of FIG. 3. The through-hole via 302 emanates from the active side 104 of the semiconductor substrate 102 and opens to the backside 106. The conductive coating 304 lines the sidewall 306 of the through-hole via 302.

The contact 108 may be an input/output pad or part of a re-distribution layer within the active side 104. The contact 108 is coupled directly to the conductive coating 304, forming a conductive path from the active side 104 to the package substrate 112.

A cured adhesive 802, such as a conductive epoxy or other epoxy, may fill the through-hole via 302. The curable adhesive 702 is subjected to a curing process, such as an ultra-violet or thermal curing process. The resulting structure is more robust and retains the benefits of the through-hole via 302 for conducting both electricity and heat.

Figure 9:
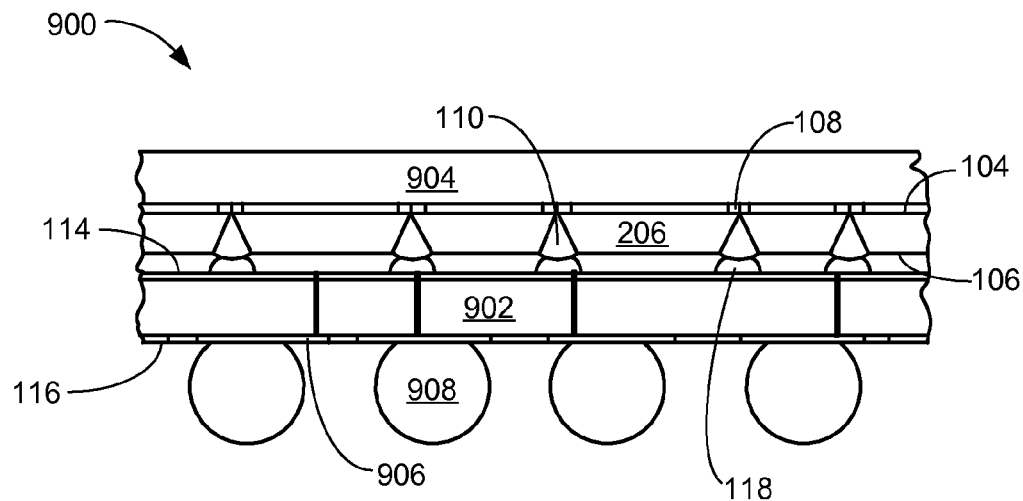
FIG. 9 is an enlarged cross-sectional view of a chip scale package singulated from the semiconductor wafer scale package system, in an embodiment of the present invention.

Referring now to FIG. 9, therein is shown an enlarged cross-sectional view of a chip scale package 900 singulated from the semiconductor wafer scale package system 100, in an embodiment of the present invention. The enlarged cross-sectional view of the chip scale package 900 depicts the semiconductor device 206 having the filled via 110 coupled to the component interconnect 118 of a chip substrate 902 of the package substrate 112 of FIG. 1. The adhesive material 120 supports the backside 106 of the semiconductor device 206. The adhesive material 120 may be between the backside 106 of the semiconductor device 206 and the component side 114 of chip substrate 902. An encapsulant 904, such as an epoxy molding compound, is over the semiconductor device 206.

The chip scale package 900, such as a BGA package, is formed by singulating, with a saw, through the encapsulant 904, the semiconductor substrate 102 of FIG. 1, and the package substrate 112 of FIG. 1. The resulting chip scale package 900 has system contacts 906 on the system side 116 of the chip substrate 902. System interconnects 908 are formed on the system contacts 906, for attachment to the next level system. The system interconnects 908 may include solder balls, solder columns, or stud bumps. The chip scale package 900 is characterized by having sides that show evidence of simultaneous singulation of the encapsulant 904, the semiconductor substrate 102, and the chip substrate 902.

Figure 10:
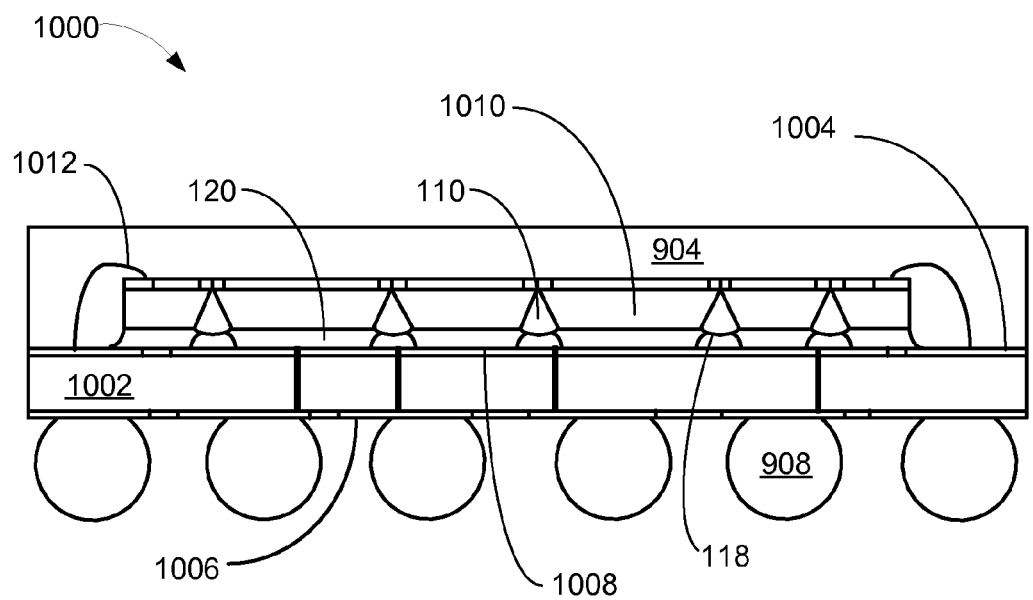
FIG. 10 is a cross-sectional view of an integrated circuit package having an integrated circuit with the filled via.

Referring now to FIG. 10, therein is shown a cross-sectional view of an integrated circuit package 1000 having an integrated circuit with the filled via 110. The cross-sectional view of an integrated circuit package 1000 depicts a substrate 1002 having a component side 1004 and a system side 1006. The component side 1004 has a central plane 1008, such as a ground plane, that supports the component interconnect 118. An integrated circuit 1010 having the filled via 110 is mounted on the component side 1004 of the substrate 1002 so that the filled via 110 is aligned with and electrically coupled to the component interconnect 118. The adhesive material 120 supports the integrated circuit 1010 and surrounds the coupling of the filled via 110 and the component interconnect 118.

A bond wire 1012 electrically connects the integrated circuit 1010 to the component side 1004 of the substrate 1002. The bond wire 1012 may couple a signal or a voltage between the integrated circuit 1010 and the substrate 1002. The encapsulant 904, such as an epoxy molding compound, may enclose the integrated circuit 1010, the bond wire 1012, and the component side 1004 of the substrate 1002.

The system side 1006 of the substrate 1002 may have system interconnects 908 that electrically connect the substrate 1002 to the next level system (not shown), such as a printed circuit board. The central plane 1008 may be of any size and may be coupled to any of the system interconnects 908.

Figure 11:
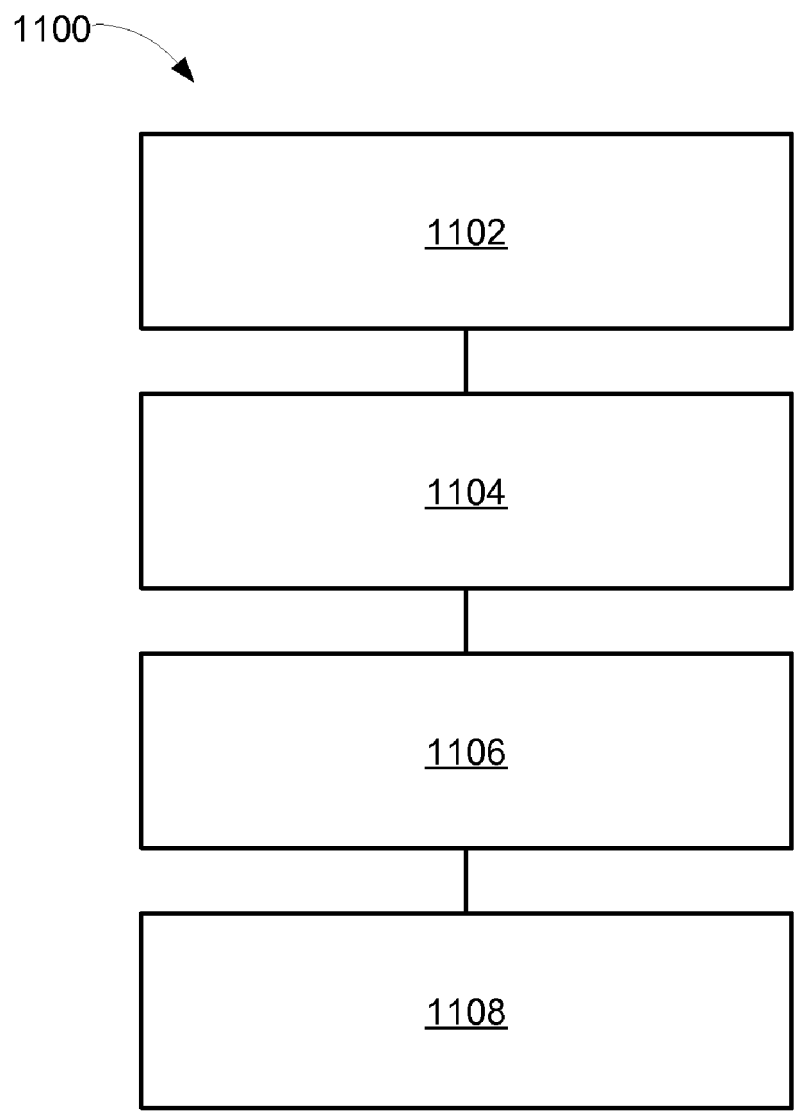
FIG. 11 is a flow chart of a semiconductor wafer scale package system for manufacturing the semiconductor wafer scale package system, in an embodiment of the present invention.

Referring now to FIG. 11, therein is shown a flow chart of a semiconductor wafer scale package system 1100 for manufacturing the semiconductor wafer scale package system 100 in an embodiment of the present invention. The system 1100 includes providing a semiconductor substrate having a through-hole via with a conductive coating in a block 1102; forming a filled via by filling the through-hole via with a conductive material in a block 1104; coupling a package substrate to the filled via in a block 1106; and singulating a chip scale package from the semiconductor substrate and the package substrate in a block 1108.

In greater detail, a system to manufacture a semiconductor wafer scale packaging system, in an embodiment of the present invention, is performed as follows:
1. Providing a semiconductor substrate having a through-hole via including forming the through-hole via near the edge of a semiconductor device. (FIG. 1)
2. Forming a conductive coating in the through-hole via by plating a gold coating. (FIG. 1)
3. Filling the through-hole via with a conductive material including spraying or printing the conductive material. (FIG. 1) and
4. Processing the conductive material for forming a filled via including applying an infrared, ultra violet or thermal process. (FIG. 6)

It has been discovered that the present invention thus has numerous aspects.

A principle aspect of the present invention is that it enhances package reliability by allowing a secure attachment between the finished wafer and the package substrate.

Another aspect is that the process of filling the through-hole vias restores the structural robustness of the wafer. Handling of the wafer becomes far less critical once the through-hole vias have been filled. Normal processing and handling equipment can manipulate the wafer with filled vias without concern about fracturing the wafer due to vibration or sudden acceleration.

Yet another important aspect of the present invention is that it valuably supports and services the historical trend of reducing costs, simplifying systems, and increasing performance. These and other valuable aspects of the present invention consequently further the state of the technology to at least the next level.

The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A semiconductor wafer scale packaging method comprising:
    providing a semiconductor substrate, with an active side and a backside, having a through-hole via lined with a conductive coating, to fill the opening at the active side, formed directly on the semiconductor substrate;
    forming a filled via by filling the through-hole via with a conductive material;
    coupling a package substrate to the filled via including the active side away from the package substrate; and
    singulating a chip scale package from the semiconductor substrate and the package substrate.

2. The method as claimed in claim 1 further comprising molding an encapsulant over the semiconductor substrate.

3. The method as claimed in claim 1 further comprising:
    forming a semiconductor device on the semiconductor substrate having the active side;
    forming a contact coupled to the semiconductor device on the active side; and
    coupling the contact to the conductive coating in the through-hole via.

4. The method as claimed in claim 1 wherein filling the through-hole via with the conductive material including using a solder paste, a solder ball, or a curable adhesive.

5. The method as claimed in claim 1 further comprising:
    forming a solder bump on a package substrate;
    aligning the solder bump with the filled via; and
    coupling the solder bump to the filled via with a reflow process.

6. A semiconductor wafer scale packaging method comprising:
    providing a semiconductor substrate, with an active side and a backside, having a through-hole via lined with a conductive coating, to fill the opening at the active side, formed directly on the semiconductor substrate, including forming the through-hole via near the edge of a semiconductor device;
    forming a filled via by filling the through-hole via with a conductive material including spraying or printing the conductive material;
    coupling a package substrate to the filled via including the active side away from the package substrate by coupling all of the filled via on the semiconductor substrate to the package substrate; and
    singulating a chip scale package from the semiconductor substrate and the package substrate including singulating the chip scale package.

7. The method as claimed in claim 6 further comprising:
    molding an encapsulant over the semiconductor substrate including molding an epoxy molding compound; and
    coupling system interconnects to the package substrate.

8. The method as claimed in claim 6 further comprising:
    forming a semiconductor device on the semiconductor substrate having the active side;
    forming a contact on the active side in which forming the contact includes forming the semiconductor device; and
    coupling the contact to the conductive coating in the through-hole via in which coupling the contact includes electroplating the conductive coating.

9. The method as claimed in claim 6 wherein filling the through-hole via with the conductive material by using a solder paste a solder ball, or a curable adhesive includes using a eutectic, high temperature solder, or conductive epoxy for coupling the through-hole via to a central plane.

10. The method as claimed in claim 6 further comprising:
    forming a solder bump on a package substrate including forming a solder ball or a solder column;
    aligning the solder bump with the filled via including aligning the semiconductor substrate with the package substrate; and
    forming a wafer scale package by coupling the solder bump to the filled via with a reflow process.

* * * * *